(12) United States Patent
Yu et al.

(10) Patent No.: US 12,406,609 B2
(45) Date of Patent: Sep. 2, 2025

(54) ELECTROMAGNETIC INTERFERENCE MODULATION CIRCUIT, POWER MANAGEMENT CHIP AND DISPLAY DEVICE

(71) Applicant: TCL CHINA STAR OPTOELECTRONICS TECHNOLOGY CO., LTD., Guangdong (CN)

(72) Inventors: Yayun Yu, Guangdong (CN); Mingjong Jou, Guangdong (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 18/305,401

(22) Filed: Apr. 24, 2023

(65) Prior Publication Data
US 2024/0144852 A1    May 2, 2024

(30) Foreign Application Priority Data
Nov. 1, 2022  (CN) .......................... 202211358173.1

(51) Int. Cl.
| | |
|---|---|
| G09G 3/20 | (2006.01) |
| G06F 1/26 | (2006.01) |
| G06F 1/3203 | (2019.01) |
| H02M 1/00 | (2007.01) |
| H02M 1/44 | (2007.01) |
| H03K 17/16 | (2006.01) |
| H03K 19/003 | (2006.01) |

(52) U.S. Cl.
CPC .............. *G09G 3/2092* (2013.01); *G06F 1/26* (2013.01); *G06F 1/3203* (2013.01);
(Continued)

(58) Field of Classification Search
CPC ......... H03K 17/165; H03K 19/018507; H03K 2217/0081; H03K 5/01; H03K 17/04206; H03K 17/042; H03K 17/166; H03K 19/00361; H03K 19/00346; H03K 17/162; H02M 1/08; H02M 1/0029; H02M 1/0025; H02M 1/0003; H02M 1/44; H02M 3/158; H02M 3/156; G06F 1/26; G06F 1/3203; G06F 3/0416; G09G 2330/021;
(Continued)

(56) References Cited

U.S. PATENT DOCUMENTS

| | | | | |
|---|---|---|---|---|
| 5,568,081 A | * | 10/1996 | Lui .................. | H03K 19/00361 327/170 |
| 8,004,330 B1 | * | 8/2011 | Acimovic ........ | H03K 19/00361 327/170 |

(Continued)

*Primary Examiner* — Dismery Mercedes
(74) *Attorney, Agent, or Firm* — PV IP PC; Wei Te Chung

(57) ABSTRACT

An electromagnetic interference modulation circuit includes an instruction module, a slew rate adjustment module, and a power stage module. The instruction module outputs a selecting signal according to an instruction signal. The slew rate adjustment module connected to the instruction module is configured to generate a plurality of electromagnetic interference modulation signals, and output an electromagnetic interference modulation signal corresponding to the selecting signal. The power stage module connected to the slew rate adjustment module and an output end is configured to output a voltage signal to the output end according to the electromagnetic interference modulation signal.

18 Claims, 5 Drawing Sheets

(52) U.S. Cl.
CPC ....... *H02M 1/0003* (2021.05); *H02M 1/0016* (2021.05); *H02M 1/0025* (2021.05); *H02M 1/0029* (2021.05); *H02M 1/44* (2013.01); *H03K 17/16* (2013.01); *H03K 17/165* (2013.01); *H03K 17/166* (2013.01); *H03K 19/00346* (2013.01); *G09G 2330/021* (2013.01); *G09G 2330/06* (2013.01); *H03K 2217/0081* (2013.01)

(58) Field of Classification Search
CPC ............. G09G 2330/06; G09G 3/2092; G11C 7/1057; G11C 5/147; G11C 7/1051
See application file for complete search history.

(56) References Cited

U.S. PATENT DOCUMENTS

| | | | | |
|---|---|---|---|---|
| 9,318,068 | B2* | 4/2016 | Stronks | G09G 3/3696 |
| 2002/0005743 | A1* | 1/2002 | Tanaka | H03K 19/018585 |
| | | | | 327/170 |
| 2005/0127947 | A1* | 6/2005 | Arnold | H03K 19/00384 |
| | | | | 326/93 |
| 2008/0232144 | A1* | 9/2008 | Klein | H02M 1/36 |
| | | | | 363/49 |
| 2011/0279158 | A1* | 11/2011 | Chen | H03K 17/145 |
| | | | | 327/170 |
| 2012/0286752 | A1* | 11/2012 | Tsukiji | H04N 5/63 |
| | | | | 323/282 |
| 2013/0315294 | A1* | 11/2013 | Ishizeki | H03K 19/018521 |
| | | | | 375/232 |
| 2013/0329466 | A1* | 12/2013 | Telefus | H02M 1/4258 |
| | | | | 363/21.12 |
| 2016/0308533 | A1* | 10/2016 | Hsu | H03K 19/018521 |
| 2017/0093283 | A1* | 3/2017 | Leoncini | H02M 1/44 |
| 2018/0159517 | A1* | 6/2018 | Bae | H04L 25/0272 |
| 2020/0020280 | A1* | 1/2020 | Han | G09G 3/3266 |
| 2021/0201740 | A1* | 7/2021 | Kim | G09G 3/20 |
| 2022/0231592 | A1* | 7/2022 | Lin | H02M 1/08 |
| 2023/0131983 | A1* | 4/2023 | Park | G06F 3/04182 |
| | | | | 345/173 |
| 2023/0402976 | A1* | 12/2023 | Arora | H03F 3/2173 |
| 2024/0097567 | A1* | 3/2024 | Cheng | H03K 7/08 |

* cited by examiner

ELECTROMAGNETIC INTERFERENCE MODULATION CIRCUIT, POWER MANAGEMENT CHIP AND DISPLAY DEVICE

CROSS REFERENCE TO RELATED APPLICATION

This application claims the priority of Chinese Patent Application No. 202211358173.1, entitled "electromagnetic interference modulation circuit, power management chip and display device", filed on Nov. 1, 2022, the disclosure of which is incorporated herein by reference in its entirety.

FIELD OF THE DISCLOSURE

The present disclosure relates to a display technology, and more particularly, to an electromagnetic interference modulation circuit, a power management chip and a display device.

BACKGROUND

The radiated electromagnetic interference (EMI) issue of the switching power supplies is a dynamically changing situational issue, which is related to the parasitic effects of the power supply itself, the circuit layout and component placement, and the power supply of the entire system. When power supply products are verified, the problem that EMI exceeds the standard specification often occurs. For example, a conventional power management chip uses a simple closed-loop control to achieve a balance between the response speed and the system stability, but cannot modulate the slew rate of the voltage supplied to the load.

However, if the slew rate modulation issue of the load voltage cannot be solved, it can only be passively rectified by the power system. In this way, it will extend the time for verifying and adjusting EMI issue and thus also increases the development time of the power supply product.

SUMMARY

One objective of an embodiment of the present disclosure is to provide an electromagnetic interference modulation circuit, a power management chip and a display device, which could modulate the slew rate of the voltage signal provided to the output end and thus effectively shortening EMI adjustment time.

According to an embodiment of the present disclosure, an electromagnetic interference modulation circuit is disclosed. The electromagnetic interference modulation circuit comprises: an instruction module, configured to output a selecting signal according to an instruction signal; a slew rate adjustment module, connected to the instruction module, configured to generate a plurality of electromagnetic interference modulation signals, and output an electromagnetic interference modulation signal corresponding to the selecting signal; and a power stage module, connected to the slew rate adjustment module and an output end, configured to output a voltage signal to the output end according to the electromagnetic interference modulation signal.

Optionally, the slew rate adjustment module comprises: a multiplexing unit, comprising a control end and a plurality of output ends, the control end is electrically connected to the instruction module; and a plurality of electromagnetic interference modulation units, all electrically connected with the power stage module, configured to control a corresponding electromagnetic interference modulation unit to output the electromagnetic interference modulation signal according to the selecting signal. The plurality of output ends of the multiplexing unit are correspondingly connected to the plurality of electromagnetic interference modulation units.

Optionally, each of the plurality of electromagnetic interference modulation units comprises: a first transistor, having a gate, an input electrode, and an output electrode, wherein the gate is electrically connected to a corresponding output end of the multiplexing unit, the input electrode is electrically connected to a first power signal, and the output electrode is connected to the power stage module; and a second transistor, having a gate, an input electrode, and an output electrode, wherein the gate is electrically connected to a corresponding output end of the multiplexing unit, the input electrode is electrically connected to a second power signal, and the output electrode is electrically connected to the power stage module. The first transistor is a P-type transistor and the second transistor is an N-type transistor.

Optionally, first conductive current values of the first transistors in the plurality of electromagnetic interference modulation units are different, and second conductive current values of the second transistors in the plurality of electromagnetic interference modulation units are different.

Optionally, a voltage level of the first power signal is greater than a voltage level of the second power signal.

Optionally, the instruction module is further configured to turn on the electromagnetic interference modulation units in accordance with a preset sequence, obtain corresponding parameter of a current electromagnetic interference modulation unit; check if the parameters meet a present condition; turn on a next electromagnetic interference modulation unit if the parameters cannot meet the preset condition; and stop turning on a next electromagnetic interference modulation unit if the parameters meet the preset condition.

Optionally, the instruction module is further configured to store the parameters corresponding to a last conductive electromagnetic interference modulation unit after stopping turning on a next electromagnetic interference modulation unit.

Optionally, the power stage module comprises a power switching transistor, having a gate, an input electrode and an output electrode; wherein the gate is electrically connected to the slew rate adjustment module, the input electrode is electrically connected to a third power signal, and the output electrode is electrically connected to the output end.

Optionally, the electromagnetic interference modulation circuit, further comprises a sampling feedback module, electrically connected to the power stage module and the output end, configured to obtain the voltage signal and provide a duty cycle modulation signal to the power stage module according to the voltage signal.

Optionally, the sampling feedback module comprises: a voltage sampling circuit, electrically connected to the output end, the feedback circuit and a ground terminal, configured to output a sampling voltage signal based on the voltage signal; a feedback circuit, electrically connected to the voltage sampling circuit, configured to receive a standard voltage signal and output a feedback signal based on the sampling voltage signal and the standard voltage signal; and a duty cycle modulation circuit, electrically connected to the feedback circuit and the power stage module, configured to provide the duty cycle modulation signal to the power stage module based on the feedback signal.

According to an embodiment of the present disclosure, a power management chip is disclosed. The power management chip comprises the above-mentioned electromagnetic interference modulation circuit.

The electromagnetic interference modulation circuit, the power management chip and the display device provided in an embodiment of the present disclosure could modulate the voltage signal provided by the power stage module to the output end by including the slew rate adjustment module. In this way, when the voltage signal at the output end changes, the slow rate can correspondingly rise or fall, thereby effectively improving EMI and shortening the EMI adjustment time.

DETAILED DESCRIPTION OF PREFERRED EMBODIMENTS

The specific structural and functional details disclosed herein are representative only and are for the purpose of describing exemplary embodiments of the present application. However, the present application may be embodied in many alternative forms and should not be construed as being limited only to the embodiments set forth herein.

It is understood that the term "first", "second" are for illustrative purposes only and are not to be construed as indicating or imposing a relative importance or implicitly indicating the number of technical features indicated. Thus, a feature that limited by "first", "second" may expressly or implicitly include at least one of the features. Since the source and drain of the transistor used in the present disclosure are symmetrical, the source and drain can be interchanged. According to the form in the accompanying drawings, it is stipulated that the middle terminal of the transistor is the gate, the input electrode is the source, and the output electrode is the drain. Or the middle terminal of the transistor is the gate, the input electrode is the drain, and the output electrode is the source.

It should be understood that, when an element or layer is referred to herein as being "disposed on", "connected to" or "coupled to" another element or layer, it can be directly disposed on, connected or coupled to the other element or layer, or alternatively, that intervening elements or layers may be present. In contrast, when an element is referred to as being "directly disposed on," "directly connected to" or "directly coupled to" another element or layer, there are no intervening elements or layers present. In the figures, like numbers refer to like elements throughout.

Figure 1:
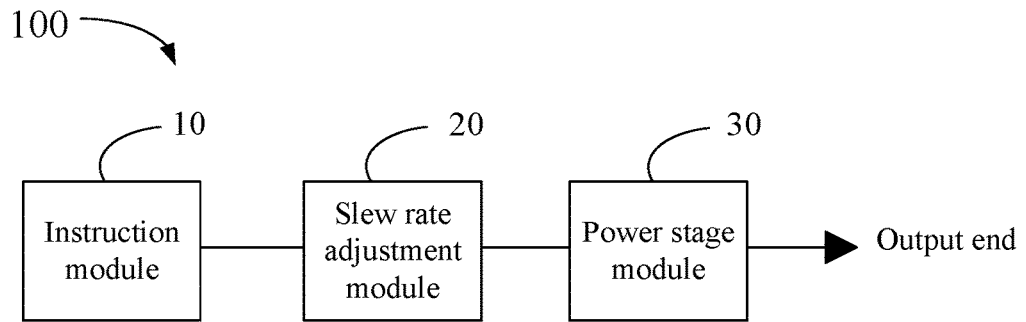
FIG. 1 is a diagram of an electromagnetic interference modulation circuit according to a first embodiment of the present disclosure.

Please refer to FIG. 1. FIG. 1 is a diagram of an electromagnetic interference modulation circuit according to a first embodiment of the present disclosure. The electromagnetic interference modulation circuit 100 comprises an instruction module 10, a slew rate adjustment module 20 and a power stage module 30.

The instruction module 10 is electrically connected to the slew rate adjustment module 20. The instruction module 10 is used to output a selecting signal to the slew rate adjustment module 20 based on the instruction signal.

The slew rate adjustment module 20 is electrically connected to the power stage module 30. The slew rate adjustment module 20 is used to generate a plurality of electromagnetic interference modulation signals and output an electromagnetic interference modulation signal corresponding to the selecting signal provided by the instruction module 10 to the power stage module 30.

The power stage module 30 is electrically connected to an output end. The power stage module 30 is used to output a voltage signal to the output end according to the electromagnetic interference modulation signal provided by the slew rate adjustment module 20.

The electromagnetic interference modulation signal received by the power stage module 30 is different. Accordingly, the edge slope of the voltage signal provided by the power stage module 30 to the output end is different, so that the voltage signal at the output end can rise or fall at the corresponding rate when the voltage signal at the output end is changing. This allows the slew rate can be large or low. When the slew rate is lower, the EMI is better but the efficiency of the power stage module 30 in providing a voltage signal to the output end is decreased (That is, the conductive efficiency of conduction is reduced). Therefore, it is a trade-off between EMI effect and conductive efficiency.

The instruction signal can be provided by an integrated circuit (I2C), a serial peripheral interface (SPI), or a microcontroller (MCU) and so on.

The output end can be electrically connected to a buck converter, a boost converter, or a GOA (gate driver on array) circuit.

The electromagnetic interference modulation circuit 100 could modulate the voltage signal provided by the power stage module 30 to the output end by including the slew rate adjustment module 20. In one aspect, it could effectively improve the EMI. In another aspect, it could find a best conductive rate to decrease the EMI adjustment time by modulating the slew rate.

Figure 2:
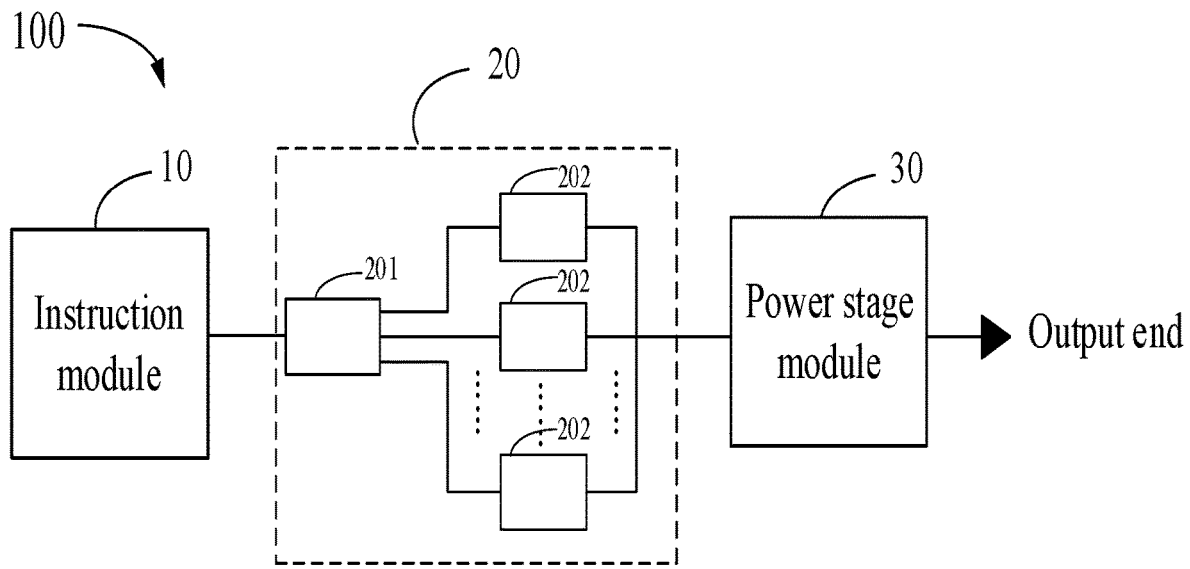
FIG. 2 is a diagram of an electromagnetic interference modulation circuit according to a second embodiment of the present disclosure.

Please refer to FIG. 2. FIG. 2 is a diagram of an electromagnetic interference modulation circuit according to a second embodiment of the present disclosure. In the electromagnetic interference modulation circuit 100 of the second embodiment, the slew rate adjustment module 20 comprises a multiplexing unit 201 and a plurality of EMI modulation units 202.

The multiplexing unit 201 comprises a control end and a plurality of output ends. The control end is electrically connected to the instruction module 10 to receive the selecting signal from the instruction module 10. The plurality of output ends are one-to-one connected to a plurality of EMI modulation units 202, so as to establish a one-to-one mapping relationship between selecting signals and EMI modulation units 202. The multiplexing unit 201 can control the corresponding EMI modulation unit 202 to output an EMI modulation signal based on the selecting signal from the instruction module 10.

The plurality of EMI modulation units 202 are connected to the power stage module 30. Thus, the power stage module 30 output a voltage signal to the output end based on the EMI modulation signal provided by the corresponding EMI modulation unit 202. Different EMI units 202 provide different EMI modulation signals, so that the slew rate of the voltage signal output by the power stage module 30 at the output end is correspondingly different. This establishes the one-to-one mapping relationship between the EMI modulation units 202 and slew rates. That is, in this embodiment, in the EMI modulation units 202, when one of the EMI modulation units 202 outputs its EMI modulation signal to the power stage module 30, the other EMI modulation unit 202 will not output EMI modulation signals to the power stage module 30. Accordingly, the power stage module 30 output a voltage signal to the output end with a slew rate corresponding to the EMI modulation unit 202 outputting the EMI modulation signal in a one-to-one mapping relationship.

Based on the one-to-one mapping relationship between selecting signals and the EMI modulation units 202 and the one-to-one mapping relationship between the EMI modulation units 202 and the slew rates, the one-to-one mapping relationship between selecting signals and slew rates can be determined. Thus, the slew rate of the voltage signal at the output end can be modulated to effectively improve the EMI effect.

The EMI modulation circuit 100 could establish a one-to-one mapping relationship between the selecting signal of the instruction module 10 and the EMI modulation unit 202 by including the multiplexing unit 201. In this way, the corresponding EMI modulation unit 202 provides the corresponding EMI modulation signal to the power stage module 30, so that the voltage signal at the output end has a corresponding slew rate. Therefore, the slew rate of the voltage signal at the output end can be modulated, which can effectively improve the EMI effect.

Figure 3:
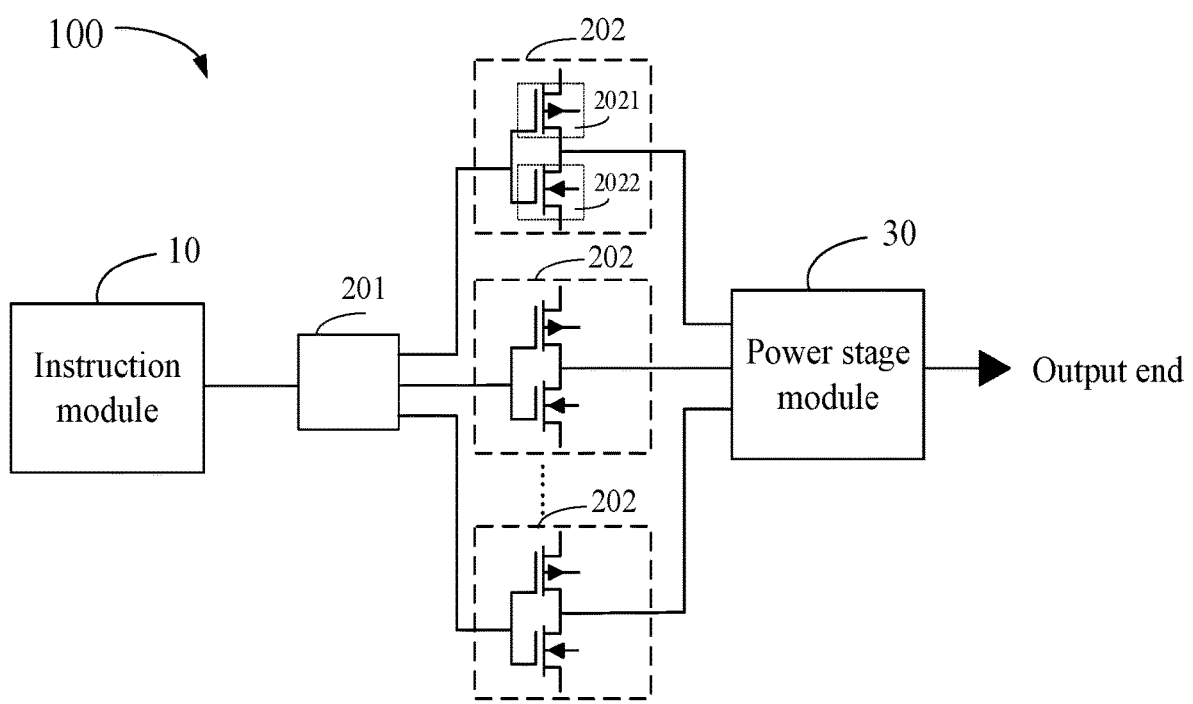
FIG. 3 is a diagram of an electromagnetic interference modulation circuit according to a third embodiment of the present disclosure.

Please refer to FIG. 3. FIG. 3 is a diagram of an electromagnetic interference modulation circuit according to a third embodiment of the present disclosure. In the electromagnetic interference modulation circuit 100 of the third embodiment, the EMI modulation unit 202 comprises a first transistor 2021 and a second transistor 2022.

The gate of the first transistor 2021 is electrically connected to the output end of the corresponding multiplexing unit 201, one of the source and drain of the first transistor 2021 is electrically connected to the first power signal, and the other one the source and drain of the first transistor 2021 is electrically connected to the power stage module 30.

The gate of the second transistor 2022 is electrically connected to the output end of the corresponding multiplexing unit 201, one of the source and drain of the second transistor 2022 is electrically connected to the second power signal, and the other one the source and drain of the first transistor 2021 is electrically connected to the power stage module 30.

The first transistor 2021 shown in FIG. 3 is a P-type transistor and the second transistor 2022 is an N-type transistor. However, this configuration is only an example, not a limitation of the present disclosure as long as the first transistor 2021 is one type of N-type transistor or P-type transistor and the second transistor 2022 is the other type of N-type transistor and P-type transistor.

The first transistor 2021 and the second transistor 2022 are included in the EMI modulation unit 2021 in a push-pull form and configured to amplify signals at the gates of the first transistor 2021 and the second transistor 2022. That is, when an EMI modulation unit 202 operates, one of the first transistor 2021 and the second transistor 2022 is turned on and the other is turned off, such that the EMI modulation unit 202 conduction has a small conductive loss and a high conductive efficiency.

Because the first transistor 2021 and the second transistor 2022 are included in the EMI modulation circuit 100 in a push-pull manner, the EMI modulation unit 202 could provide currents to the power stage module 30 or could draw currents from the power stage module 30.

When the multiplexing unit 201 outputs a conduction signal to the corresponding EMI modulation unit 202 to make the corresponding EMI modulation unit 202 work, the first transistor 2021 is turned on and the second transistor 2022 is in the cut-off state. Conversely, when the first transistor 2021 is in the cut-off state, the second transistor 2022 is turned on. Because the first transistor 2021 or the second transistor 2022 is turned on, the first transistor 2021 is connected to the first power signal and the second transistor 2022 is connected to the second power signal, the first transistor 2021 could provide a current to the power stage module 30 to turn on the power stage module 30 or the second transistor 2022 draw a current from the power stage module 30 to turn off the power stage module 30. Thus, the EMI modulation unit 202 can turn on/off the power stage module 30.

The current supplied to the power stage module 30 or the current drawn from the power stage module 30 is the current flowing through the first transistor 2021 or the second transistor 2022 when the first transistor 2021 or the second transistor 2022 is turned on. The amplitude of the current flowing through the transistor directly affects the efficiency of the power stage module 30 to output the voltage signal to the output end, thereby affecting the slew rate of the voltage signal at the output end. The corresponding EMI modulation unit 202 provides the corresponding current to the power stage module 30, and the slew rate of the voltage signal at the output end can be modulated accordingly to effectively improve the EMI effect.

Please refer to FIG. 2 and FIG. 3. The plurality of EMI modulation units 202 provide different EMI modulation signals. The differences of the EMI modulation signals are achieved by the different currents flowing through the first transistors 2021 or the second transistors 2022. In some embodiments, the first transistors 2021 have different first currents because their equivalent resistances are set to be different, and the second transistors 2022 have different second currents because their equivalent resistances are set to be different. In this way, the switching efficiency of the power stage module 30 correspondingly becomes different because the EMI modulation units 202 are different. Accordingly, the power stage module 30 has different output efficiencies to output a voltage signal to the output end and thus the slew rate of the voltage signal at the output end is different. Therefore, by selecting one corresponding EMI modulation unit 202 from the plurality of EMI modulation units 202 to turn on, the slew rate of the voltage signal at the output end can be modulated such that the EMI is modulated.

Please refer to FIG. 3. In the EMI modulation unit 202, when the voltage level of the first power signal is greater than the voltage level of the second power signal, the first transistor 2021 is a P-type transistor and the second transistor 2022 is an N-type transistor.

When the first transistor 2021 is turned on and the second transistor 2022 is turned off, there is a voltage difference between the first power signal and the power stage module 30. The first transistor 2021 provides the first current to the power stage module 30 according to the first power signal to charge the power stage module 30 such that the power stage module 30 is turned on. When the first transistor 2021 is turned off and the second transistor 2022 is turned on, there is a voltage difference between the power stage module 30 and the second power signal. The second transistor 2022 draws a current from the power stage module 30 according to the second power signal to discharge the power stage module 30 such that the power stage module 30 is turned off. In this way, the EMI modulation circuit including the first transistor 2021 and the second transistor 2022 connected to form a push-pull structure can be suitable for low voltage and high current occasions, and can be widely used in switching power supplies in different scenarios.

In another embodiment, when the voltage level of the first power signal is greater than the voltage level of the second power signal, the first transistor 2021 may be an N-type transistor, and the second transistor 2022 may be a P-type transistor.

In this embodiment, the first transistor 2021 and the second transistor 2022 may be field effect transistors (FET) and/or bipolar junction transistors (BJT).

In this embodiment, when the voltage level of the first power signal is greater than the voltage level of the second power signal, the first power signal may be a positive power voltage signal or the highest positive power voltage signal, and the second power signal may be a ground voltage signal, a negative power voltage signal or a minimum negative power voltage signal. Conversely, when the voltage level of the first power signal is lower than the voltage level of the second power signal, the first power signal can be a ground voltage signal, a negative power voltage signal or the lowest negative power voltage signal, and the second power signal can be a positive power voltage signal or the highest positive power voltage signal.

Figure 4:
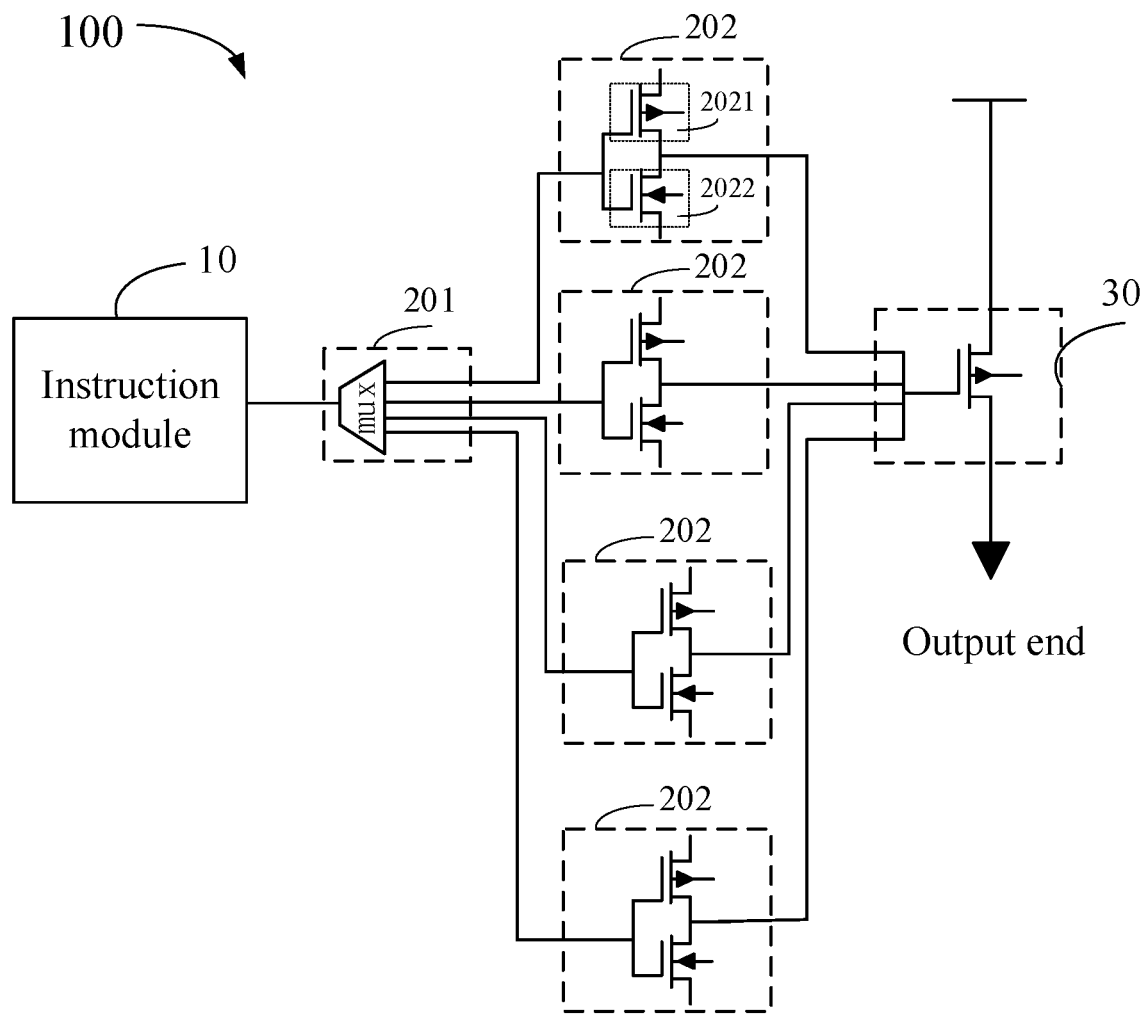
FIG. 4 is a diagram of an electromagnetic interference modulation circuit according to a fourth embodiment of the present disclosure.

Please refer to FIG. 4. FIG. 4 is a diagram of an electromagnetic interference modulation circuit according to a fourth embodiment of the present disclosure. In this embodiment, in the EMI modulation circuit 100, the power stage module 30 comprises a power switching transistor.

The gate of the power switching transistor is electrically connected to the slew rate adjustment module 20. One of the source and drain of the power switching transistor is electrically connected to the third power signal, and the other of the source and drain of the power switching transistor is electrically connected to the output end.

The plurality of EMI modulation units 202 in the slew rate adjustment module 20 are electrically connected to the gate of the power switching transistor. By controlling different EMI modulation units 202 to turn on an EMI modulation unit 202, the slew rate adjustment module 20 could output a corresponding current to the gate of the power switching transistor, so that the voltage level at the gate of the power switching transistor is different. In this way, the conductive rate of the power switching transistor is correspondingly different, the slew rate of the voltage signal output to the output end through the power switching transistor is different, and the EMI effect is not the same. Therefore, the EMI modulation circuit 100 can realize the modulation of EMI in the switching power supply.

The power switching transistor of the EMI modulation circuit 100 can be implemented with a transistor, which could withstand a large current and a small leakage current and have good saturation conductive characteristics and cut-off characteristics under certain conditions. Although the power switching transistor shown in FIG. 4 is a P-type transistor, the power switching transistor can also be an N-type transistor.

Please refer to FIGS. 1-4. The instruction module 10 is further configured to: turn on the EMI modulation units 202 in the preset sequence and obtain the parameters corresponding to the EMI modulation units 202; check if parameters corresponding to a current EMI modulation unit 202 meet a present condition; turn on a next EMI modulation unit 202 if the parameters corresponding to a current EMI modulation unit 202 cannot meet the preset condition; and stop turning on a next electromagnetic interference modulation unit if the parameters meet the preset condition. After stopping turning on the next EMI modulation unit 202, the instruction module 10 is further configured to store the parameters corresponding to the last conducted EMI modulation unit 202 (the current EMI modulation unit 202). It should be noted that in the entire method, only one EMI modulation unit 202 is turned on at a time. That is, the other EMI modulation units 202 are turned off. Therefore, the step of turning on the EMI modulation units 202 in accordance with the preset sequence further comprises turning off the other EMI modulation units 202.

In this embodiment, the turn-on sequence of the EMI modulation units 202 could be determined according to the amplitudes of the first conductive currents of the first transistors 2021.

The turn-on sequence of the EMI interference modulation units 202 is determined according to the amplitudes of the first currents from the largest to the lowest. That is, the EMI modulation unit 202 corresponding to a larger first current is turned on earlier. Therefore, the instruction module 10 first turn on the EMI modulation unit 202 with the largest first current, so that the conductive rate of the power stage module 30 is modulated from fast to slow. That is, the slew rate is modulated from fast to slow.

The slower the slew rate, the better the EMI effect, but the lower the conductive efficiency. If the conductive efficiency is lower, it takes longer for the power stage module 30 to make the voltage signal at the output end to reach the voltage level required by the load. Therefore, the slew rate is modulated from fast to slow. The purpose is to find the fastest slew rate under the condition that the EMI still meets the standard specifications. This can solve EMI issue and have a better slew gate. It is beneficial to achieve a balance between the response speed and system stability.

The conductive order of the plurality of EMI modulation units 202 is determined by the magnitude of the first current from small to large. That is, the EMI modulation unit 202 with a smaller first current will be conductive earlier. The conductive order of the plurality of EMI modulation units 202 is determined by the magnitude of the second current.

The corresponding parameters of the EMI modulation unit 202 specifically include the conductive rate of the power stage module 30 and the actual radiation frequency of the EMI. Here, the preset condition refers to the reference radiation frequency range of EMI. That is, when the actual radiation frequency of EMI corresponding to the currently-conductive EMI modulation unit 202 is checked to be not in the reference radiation frequency range, the next EMI modulation unit 202 is turned on to be conductive. Then, the actual radiation frequency of EMI corresponding to this EMI modulation unit 202 is checked to see if it's in the reference radiation frequency range. If not, then this step goes to turn on a further next EMI modulation unit 202 until the actual radiation frequency of EMI corresponding to the EMI modulation unit 202 is checked to be in the reference radiation frequency range. Then, this step stops because there is no need to turn on the next electromagnetic interference modulation unit 202.

Please refer to FIG. 4. The multiplexing unit 201 can be a multiplexer (MUX). The control end of the multiplexer unit is connected to the instruction module 10. The multiple output ends of the multiplexer unit are connected to the plurality of electromagnetic interference modulation units 202 in a one-to-one correspondence, and the input end of the multiplexer is connected to a turn-on voltage signal.

Taking the multiplexer having 4 output ends as an example. That is, the multiplexer includes the first output end, the second output end, the third output end and the fourth output end. Correspondingly, the first output end is connected to the first EMI modulation unit, the second output end is connected to the second EMI modulation unit, the third output end is connected to the third EMI modulation unit, and the fourth output end is connected to the fourth EMI modulation unit.

When the selecting signal received by the control terminal of the multiplexer is 00, the multiplexer provides the turn-on voltage signal to the first output end, so that the first EMI modulation unit provides the corresponding EMI modulation signal to the power switching transistor based on the turn-on voltage signal.

When the selecting signal received by the control terminal of the multiplexer is 01, the multiplexer provides the turn-on voltage signal to the second output end, so that the second EMI modulation unit provides the corresponding EMI modulation signal to the power switching transistor based on the turn-on voltage signal.

When the selecting signal received by the control terminal of the multiplexer is 10, the multiplexer provides the turn-on voltage signal to the third output end, so that the third EMI modulation unit provides the corresponding EMI modulation signal to the power switching transistor based on the turn-on voltage signal.

When the selecting signal received by the control terminal of the multiplexer is 11, the multiplexer provides the turn-on voltage signal to the fourth output end, so that the fourth EMI modulation unit provides the corresponding EMI modulation signal to the power switching transistor based on the turn-on voltage signal.

Figure 5:
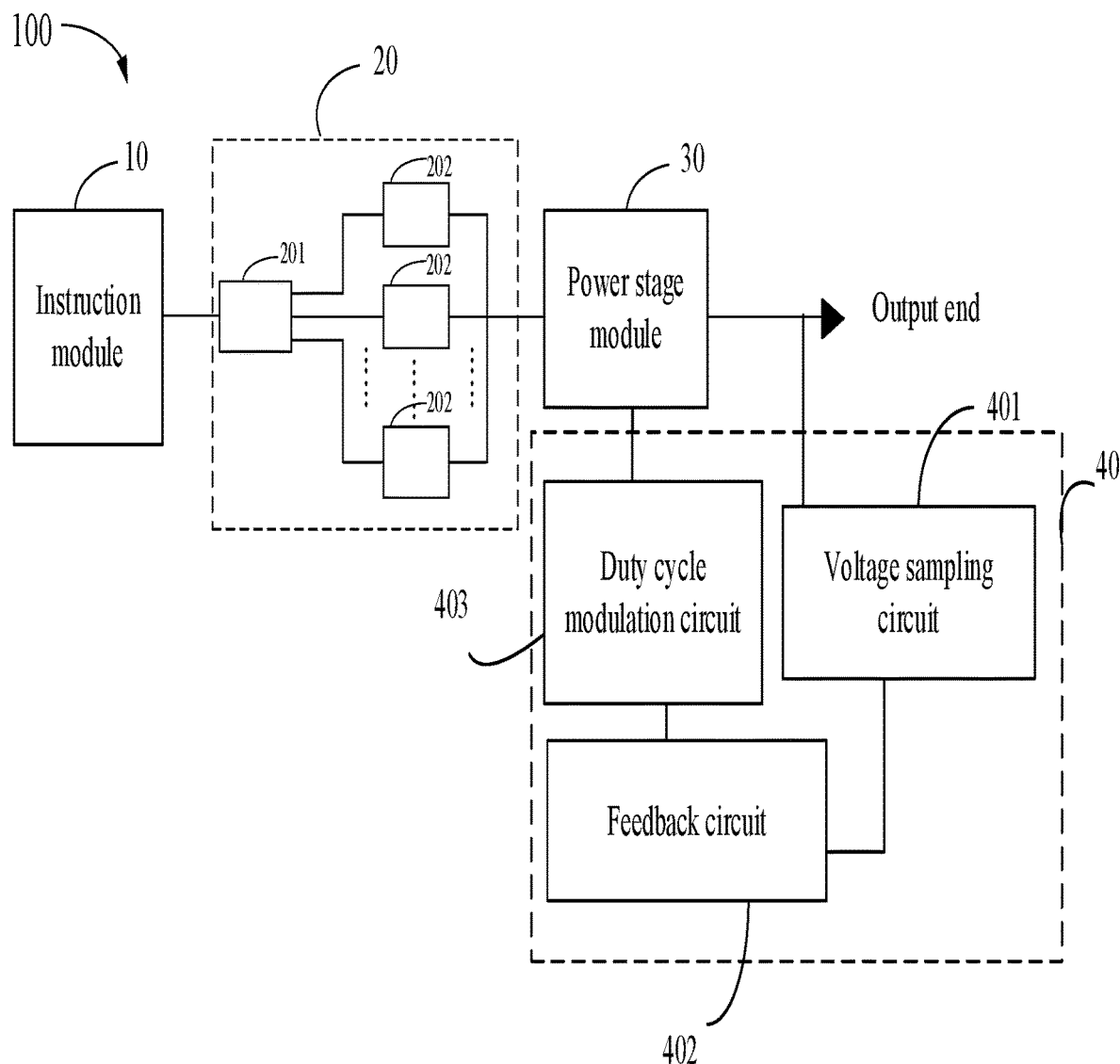
FIG. 5 is a diagram of an electromagnetic interference modulation circuit according to a fifth embodiment of the present disclosure.

Please refer to FIG. 5. FIG. 5 is a diagram of an electromagnetic interference modulation circuit according to a fifth embodiment of the present disclosure. In this embodiment, the EMI modulation circuit 100 further comprises a sampling feedback module 40.

The sampling feedback module 40 is respectively connected to the power stage module 30 and the output end. The sampling feedback module is used to receive the voltage signal at the output end and provide a duty cycle modulated signal to the power stage module 30 according to the voltage signal at the output end.

The sampling feedback module 40 includes a voltage sampling circuit 401, a feedback circuit 402, and a duty cycle modulation circuit 403.

The voltage sampling circuit 401 is respectively connected to the output end, the feedback circuit 402, and the ground terminal. The voltage sampling circuit 401 outputs a sampling voltage signal to the feedback circuit 402 based on the voltage signal at the output end.

The feedback circuit 402 is connected to the duty cycle modulation circuit 403, and the feedback circuit 402 is connected to a standard voltage signal. In this way, the feedback circuit 402 outputs a feedback signal to the duty cycle modulation circuit 403 according to the sampling voltage signal and a standard voltage signal provided by the voltage sampling circuit 401.

The duty cycle modulation circuit 403 is connected to the power stage module 30. The duty cycle modulation circuit 403 is used to provide a duty cycle modulation signal to the power stage module 30 according to the feedback signal.

The EMI modulation circuit 100 further controls the conductive time of the power stage module 30 based on the sampling feedback module 40 by including the sampling feedback module 40 to ensure that the power stage module 30 can provide an appropriate voltage signal to the output end.

Figure 6:
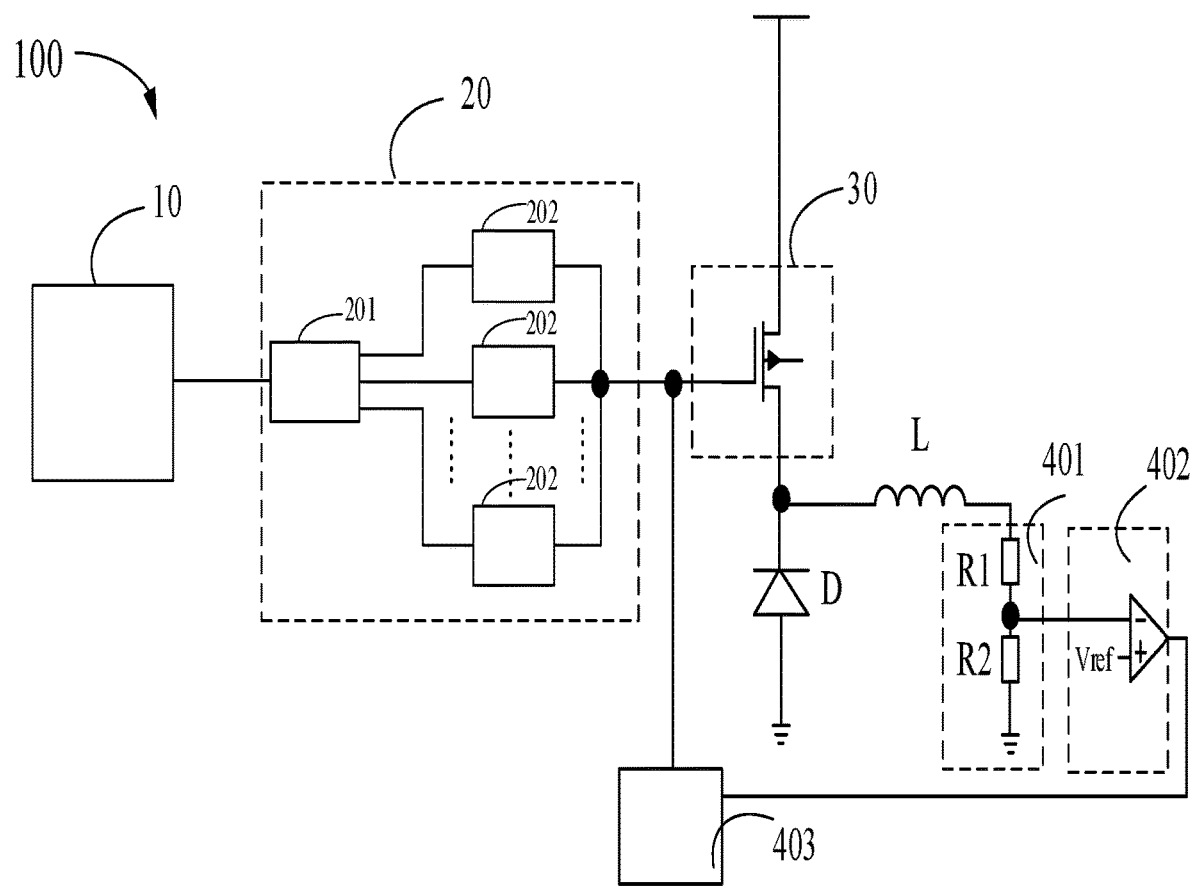
FIG. 6 is a diagram of an electromagnetic interference modulation circuit according to a sixth embodiment of the present disclosure.

Please refer to FIG. 6. FIG. 6 is a diagram of an electromagnetic interference modulation circuit according to a sixth embodiment of the present disclosure. The voltage sampling circuit 401 includes a first resistor R1 and a second resistor R2. The feedback circuit 402 comprises a comparator.

The first end of the first resistor R1 is connected to the output end. The second end of the first resistor R1 is connected to the first end of the second resistor R2. The second end of the second resistor R2 is connected to the ground terminal. Thus, in the voltage sampling circuit 401, the voltage sampling circuit outputs a sampling voltage signal to the feedback circuit 402 based on the voltage signal at the output end. The voltage level of the sampled voltage signal obtained by the feedback circuit 402 is the voltage level at the first end of the second resistor R2.

The inverting input end of the comparator is electrically connected to the sampling voltage signal. The normal-phase input end of the comparator is electrically connected to the standard voltage signal Vref. The output end of the comparator is electrically connected to the duty cycle modulation circuit 403. The comparator compares the voltage levels of the sampled voltage signal and the standard voltage signal Vref at the normal-phase input end and inverting input end, so that the comparison result is provided as a feedback signal to the duty cycle modulation circuit 403.

The duty cycle modulation circuit 403 is electrically connected to the gate of the power switching transistor in the power stage module 30, so that the duty cycle modulation circuit 403 provides a duty cycle modulation signal to the gate of the power switching transistor according to the feedback signal. In this way, the duty cycle of the voltage signal at the gate of the power switching transistor can be modulated, so that the sampling feedback module 40 could control the conductive time the power switching transistor to ensure that the power switching transistor can provide an appropriate voltage signal to the output end.

FIG. 6 also shows a diode D and an inductor L. The first end of diode D is electrically connected to the output end. The second terminal of diode D is electrically connected to ground. The first end of inductor L is electrically connected to the output end. The second end of inductor L is electrically connected to the first end of the first resistor R1. The connection relationship between diode D and inductor L is a common configuration of a buck circuit. Therefore, the diode D and the inductor L are not further illustrated herein.

According to an embodiment of the present disclosure, a power management chip is disclosed. The power management chip comprises any of the aforementioned EMI modulation circuits, so that the power management chip could modulate the slew rate of the voltage signal provided to the load by including the slew rate adjustment module. In this way, the EMI effect in the power management chip can be modulated, and the time for adjusting EMI in the power management chip can be effectively shortened.

According to an embodiment of the present disclosure, a display device is disclosed. The display device comprises a display panel and any power management chips in the aforementioned embodiments. By including the slew rate modulation module in the power management chip, the display device could modulate the slew rate of the voltage signal provided to the display panel such that the EMI effect in the display device could be modulated.

Above are embodiments of the present disclosure, which does not limit the scope of the present disclosure. Any modifications, equivalent replacements or improvements within the spirit and principles of the embodiment described above should be covered by the protected scope of the disclosure.

What is claimed is:

1. An electromagnetic interference modulation circuit, comprising:
    a slew rate adjustment circuit, configured to generate a plurality of electromagnetic interference modulation signals, and output an electromagnetic interference modulation signal corresponding to a selecting signal;
    a power stage circuit, connected to the slew rate adjustment circuit and an output end, configured to output a voltage signal to the output end according to the electromagnetic interference modulation signal; and
    a sampling feedback circuit, electrically connected to the power stage circuit and the output end, configured to obtain the voltage signal and provide a duty cycle modulation signal to the power stage circuit according to the voltage signal,
    wherein the slew rate adjustment circuit further comprises a plurality of electromagnetic interference modulation units, all electrically connected with the power stage circuit, configured to control a corresponding electromagnetic interference modulation unit to output the electromagnetic interference modulation signal according to the selecting signal,
    wherein each of the plurality of electromagnetic interference modulation units comprises a first transistor and a second transistor in a push-pull form and configured to amplify signals at gates of the first transistor and the second transistor.

2. The electromagnetic interference modulation circuit of claim 1, wherein the slew rate adjustment circuit comprises:
    a multiplexing unit, comprising a control end for receiving the selecting signal and a plurality of output ends;
    wherein the plurality of output ends of the multiplexing unit are respectively connected to the plurality of electromagnetic interference modulation units.

3. The electromagnetic interference modulation circuit of claim 2,
    wherein the gate of the first transistor is electrically connected to a corresponding output end of the multiplexing unit, an input electrode of the first transistor is electrically connected to a first power signal, and an output electrode of the first transistor is connected to the power stage circuit; and
    wherein the gate of the second transistor is electrically connected to a corresponding output end of the multiplexing unit, an input electrode of the second transistor is electrically connected to a second power signal, and an output electrode of the second transistor is electrically connected to the power stage circuit;
    wherein the first transistor is a P-type transistor and the second transistor is an N-type transistor.

4. The electromagnetic interference modulation circuit of claim 3, wherein first conductive current values of the first transistors in the plurality of electromagnetic interference modulation units are different, and second conductive current values of the second transistors in the plurality of electromagnetic interference modulation units are different.

5. The electromagnetic interference modulation circuit of claim 3, wherein a voltage level of the first power signal is greater than a voltage level of the second power signal.

6. The electromagnetic interference modulation circuit of claim 2, wherein the electromagnetic interference modulation units are sequentially turned on until a parameter of one of the electromagnetic interference modulation units meets a preset condition.

7. The electromagnetic interference modulation circuit of claim 6, wherein the parameter of a last conductive electromagnetic interference modulation unit is stored.

8. The electromagnetic interference modulation circuit of claim 1, wherein the power stage circuit comprises a power switching transistor, having a gate, an input electrode and an output electrode; wherein the gate is electrically connected to the slew rate adjustment circuit, the input electrode is electrically connected to a power voltage signal, and the output electrode is electrically connected to the output end.

9. The electromagnetic interference modulation circuit of claim 1, wherein the sampling feedback circuit comprises:
    a voltage sampling circuit, electrically connected to the output end and a ground terminal, configured to output a sampling voltage signal based on the voltage signal;
    a feedback circuit, electrically connected to the voltage sampling circuit, configured to receive a standard voltage signal and output a feedback signal based on the sampling voltage signal and the standard voltage signal; and
    a duty cycle modulation circuit, electrically connected to the feedback circuit and the power stage circuit, configured to provide the duty cycle modulation signal to the power stage circuit based on the feedback signal.

10. A power management chip, comprising an electromagnetic interference modulation circuit, the electromagnetic interference modulation circuit comprising:
    a slew rate adjustment circuit, configured to generate a plurality of electromagnetic interference modulation signals, and output an electromagnetic interference modulation signal corresponding to a selecting signal;
    a power stage circuit, connected to the slew rate adjustment circuit and an output end, configured to output a voltage signal to the output end according to the electromagnetic interference modulation signal; and
    a sampling feedback circuit, electrically connected to the power stage circuit and the output end, configured to obtain the voltage signal and provide a duty cycle modulation signal to the power stage circuit according to the voltage signal,
    wherein the slew rate adjustment circuit further comprises a plurality of electromagnetic interference modulation units, all electrically connected with the power stage circuit, configured to control a corresponding electromagnetic interference modulation unit to output the electromagnetic interference modulation signal according to the selecting signal,
    wherein each of the plurality of electromagnetic interference modulation units comprises a first transistor and a second transistor in a push-pull form and configured to amplify signals at gates of the first transistor and the second transistor.

11. The power management chip of claim 10, wherein the slew rate adjustment circuit comprises:
a multiplexing unit, comprising a control end for receiving the selecting signal and a plurality of output ends;
wherein the plurality of output ends of the multiplexing unit are respectively connected to the plurality of electromagnetic interference modulation units.

12. The power management chip of claim 11,
wherein the gate of the first transistor is electrically connected to a corresponding output end of the multiplexing unit, an input electrode of the first transistor is electrically connected to a first power signal, and an output electrode of the first transistor is connected to the power stage circuit; and
wherein the gate of the second transistor is electrically connected to a corresponding output end of the multiplexing unit, an input electrode of the second transistor is electrically connected to a second power signal, and an output electrode of the second transistor is electrically connected to the power stage circuit;
wherein the first transistor is a P-type transistor and the second transistor is an N-type transistor.

13. The power management chip of claim 12, wherein first conductive current values of the first transistors in the plurality of electromagnetic interference modulation units are different, and second conductive current values of the second transistors in the plurality of electromagnetic interference modulation units are different.

14. The power management chip of claim 12, wherein a voltage level of the first power signal is greater than a voltage level of the second power signal.

15. The power management chip of claim 11, wherein the electromagnetic interference modulation units are sequentially turned on until a parameter of one of the electromagnetic interference modulation units meets a preset condition.

16. The power management chip of claim 15, wherein the parameter of a last conductive electromagnetic interference modulation unit is stored.

17. The power management chip of claim 10, wherein the power stage circuit comprises a power switching transistor, having a gate, an input electrode and an output electrode; wherein the gate is electrically connected to the slew rate adjustment circuit, the input electrode is electrically connected to a power voltage signal, and the output electrode is electrically connected to the output end.

18. A display device, comprising a display panel and an electromagnetic interference modulation circuit, the electromagnetic interference modulation circuit comprising:
a slew rate adjustment circuit, configured to generate a plurality of electromagnetic interference modulation signals, and output an electromagnetic interference modulation signal corresponding to a selecting signal;
a power stage circuit, connected to the slew rate adjustment circuit and an output end, configured to output a voltage signal to the output end according to the electromagnetic interference modulation signal; and
a sampling feedback circuit, electrically connected to the power stage circuit and the output end, configured to obtain the voltage signal and provide a duty cycle modulation signal to the power stage circuit according to the voltage signal,
wherein the slew rate adjustment circuit further comprises a plurality of electromagnetic interference modulation units, all electrically connected with the power stage circuit, configured to control a corresponding electromagnetic interference modulation unit to output the electromagnetic interference modulation signal according to the selecting signal,
wherein each of the plurality of electromagnetic interference modulation units comprises a first transistor and a second transistor in a push-pull form and configured to amplify signals at gates of the first transistor and the second transistor.

* * * * *